(12) United States Patent
Loh et al.

(10) Patent No.: US 12,476,350 B2
(45) Date of Patent: Nov. 18, 2025

(54) FLEXIBLE COMPOSITE SUBSTRATE FOR WEARABLE ANTENNA

(71) Applicant: Jabil Inc., St. Petersburg, FL (US)

(72) Inventors: Yen San Loh, Georgetown (MY); Lai Ming Lim, Bukit Mertajam (MY); Zambri Samsudin, Gelugor (MY)

(73) Assignee: Jabil Inc., St. Petersburg, FL (US)

( * ) Notice: Subject to any disclaimer, the term of this patent is extended or adjusted under 35 U.S.C. 154(b) by 200 days.

(21) Appl. No.: 18/447,613

(22) Filed: Aug. 10, 2023

(65) Prior Publication Data

US 2024/0088544 A1   Mar. 14, 2024

(30) Foreign Application Priority Data

Sep. 8, 2022  (MY) .......................... UI 2022004899

(51) Int. Cl.
*H01Q 1/27* (2006.01)
*H01Q 1/38* (2006.01)
*H05K 1/02* (2006.01)

(52) U.S. Cl.
CPC ............... *H01Q 1/273* (2013.01); *H01Q 1/38* (2013.01); *H05K 1/028* (2013.01); *H05K 2201/0141* (2013.01); *H05K 2201/015* (2013.01); *H05K 2201/0154* (2013.01)

(58) Field of Classification Search
CPC .......... H01Q 1/273; H01Q 1/38; H01Q 1/085; H01Q 1/48; H05K 1/028; H05K 2201/0141; H05K 2201/015; H05K 2201/0154; B29D 7/00; B32B 27/12; B32B 27/18; B32B 27/281; B32B 27/322; B32B 33/00; B32B 2307/7265; B32B 2307/73; B32B 2457/00; D06M 15/256; D06M 15/59; D06M 15/643
See application file for complete search history.

(56) References Cited

U.S. PATENT DOCUMENTS

| | | | |
|---|---|---|---|
| 7,567,209 B2 | 7/2009 | Tanaka et al. | |
| 10,944,161 B2 | 3/2021 | Kim et al. | |
| 11,055,588 B2 * | 7/2021 | Chandramowle | ........................... G06K 19/07722 |
| 12,075,564 B2 * | 8/2024 | Lee | ........................ D06M 23/16 |
| 2005/0110680 A1 | 5/2005 | Tanaka et al. | |
| 2022/0064466 A1 * | 3/2022 | Pujari | .................. H05K 3/0011 |

FOREIGN PATENT DOCUMENTS

JP  2020184719 A  * 11/2020
KR  102236940 B1  *  4/2021

OTHER PUBLICATIONS

Mahood et al. ("Recent Advances in Wearable Antenna Technologies: A Review", (Year: 2020)).*

* cited by examiner

*Primary Examiner* — Seung H Lee
(74) *Attorney, Agent, or Firm* — Young Basile Hanlon & MacFarlane, P.C.

(57) ABSTRACT

A flexible composite substrate for a wearable antenna includes a fabric sheet and a single-layer dielectric film immersed into the fabric sheet. The single-layer dielectric film includes a dielectric resin matrix and a low dielectric loss material which is mixed with the dielectric resin matrix and which serves as a wireless functional dielectric interface material.

20 Claims, 4 Drawing Sheets

FLEXIBLE COMPOSITE SUBSTRATE FOR WEARABLE ANTENNA

CROSS-REFERENCE TO RELATED APPLICATION

This application claims priority to Malaysian Utility Innovation Application No. UI2022004899, filed on Sep. 8, 2022, which is incorporated by reference herein in its entirety.

FIELD

The disclosure relates to a flexible composite substrate, and more particularly to a flexible composite substrate for a wearable antenna. The disclosure also relates to a method for manufacturing the flexible composite substrate and a wearable antenna including the flexible composite substrate.

BACKGROUND

Wireless communication systems use radio frequencies to transmit information through the air. Fifth-generation (5G) communication systems operate in the same way but using higher frequencies that are less cluttered, such that more information can be transmitted at a much faster rate. The 5G communication systems use a communication technology that can perform high-speed, large-capacity and low-delay communication, and multiple simultaneous connection. The 5G communication systems use radio frequencies, which not only cover a frequency band below 6 GHz (that includes a frequency band used for 4th generation (4G) networks), but also extend into a much higher frequency band ranging, for example, from about 24 GHz to about 100 GHz (known as millimeter wave (mmWave)).

There are a number of challenges associated with use of high-performance materials in the 5G communication systems that may transmit high frequency signals. The high-performance materials for making communication devices in a range of applications, which include, for example, flexible printed circuits (FPCs), printed circuit boards (PCBs), wire and cables, smart devices, base station antennas, and the like, to be used in the 5G communication systems must exhibit exceptional dielectric properties including a low dielectric constant, so as to mitigate signal loss.

A conventional substrate for an electronic textile (e-textile) has acceptable dielectric properties for the wireless communication systems which use radio frequencies in the megahertz range. However, the conventional substrate, when used in the aforesaid much higher frequency band in the 5G communication systems, would suffer from significant dielectric loss.

SUMMARY

Therefore, a first object of the disclosure is to provide a flexible composite substrate for a wearable antenna that can be used in the 5G communication systems.

A second object of the disclosure is to provide a wearable antenna including the flexible composite substrate.

A third object of the disclosure is to provide a method for manufacturing the flexible composite substrate.

According to a first aspect of the disclosure, a flexible composite substrate for a wearable antenna includes a fabric sheet and a single-layer dielectric film immersed into the fabric sheet. The single-layer dielectric film includes a dielectric resin matrix and a low dielectric loss material which is mixed with the dielectric resin matrix and which serves as a wireless functional dielectric interface material.

According to a second aspect of the disclosure, a wearable antenna includes a flexible composite substrate, a conductive antenna layer, and a conductive ground layer. The flexible composite substrate includes a fabric sheet and a single-layer dielectric film immersed into the fabric sheet. The conductive antenna layer and the conductive ground layer are disposed at the flexible composite substrate.

According to a third aspect of the disclosure, a method for manufacturing a flexible composite substrate for a wearable antenna includes the steps of: providing a liquid mixture which includes a dielectric resin matrix and a low dielectric loss material; forming the liquid mixture into a single-layer dielectric film; and laminating the single-layer dielectric film with a fabric sheet to form the flexible composite substrate.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
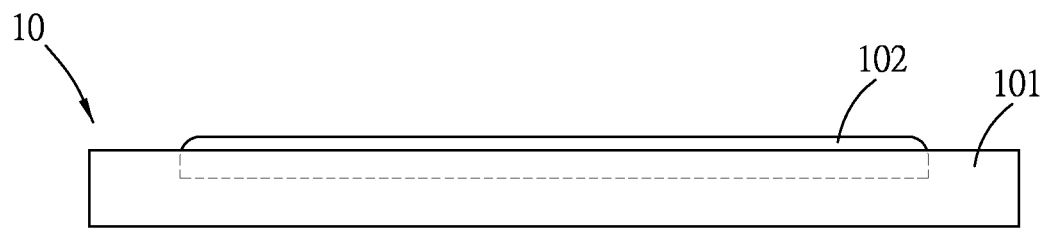
FIG. 1 is a schematic view illustrating an embodiment of a flexible composite substrate for a wearable antenna according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a flexible composite substrate 10 according to the disclosure can be used for manufacturing a wearable antenna, and includes a fabric sheet 101 and a single-layer dielectric film 102 immersed into the fabric sheet 101. The fabric sheet 101 may have any suitable fabric composition, for example, but not limited to, cotton, polyester, wool, silk, nylon, rayon, rubber, plastic, leather, or combinations thereof. The single-layer dielectric film 102 includes a dielectric resin matrix and a low dielectric loss material which is mixed with the dielectric resin matrix and which serves as a wireless functional dielectric interface material.

In some embodiments, the dielectric resin matrix may include, for example, but not limited to, silicone resin, or the like. In some embodiments, the low dielectric loss material may include, for example, but not limited to, polyimide (PI), polytetrafluoroethylene (PTFE), liquid crystal polymer (LCP), or the like, or combinations thereof.

The flexible composite substrate 10 may be manufactured by a lamination method, a coating method, a printing method, or the like.

Figure 2:
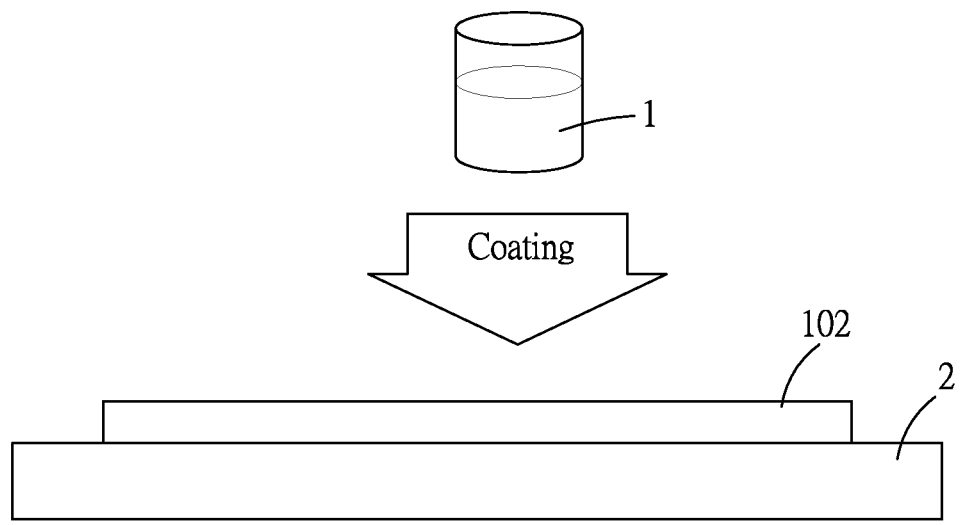
FIGS. 2 and 3 are schematic views illustrating some intermediate steps of a lamination method for manufacturing the embodiment shown in FIG. 1.
Figure 3:
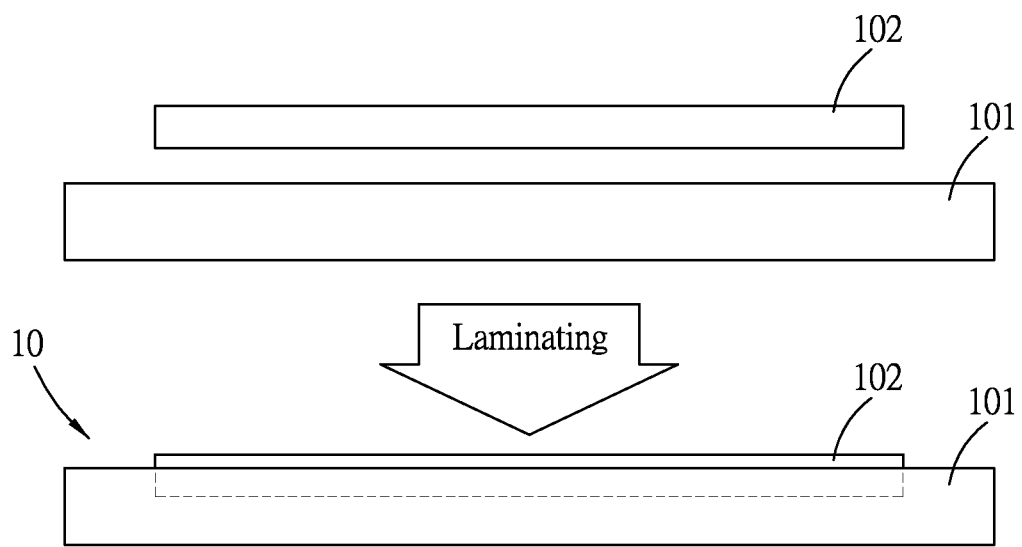

Referring to FIGS. 2 and 3, the lamination method for manufacturing the flexible composite substrate 10 includes the steps of: applying a liquid mixture 1, which includes the dielectric resin matrix and the low dielectric loss material, on a blank liner 2 by a suitable applying technique (for example, but not limited to, coating, or the like); forming the liquid mixture into the single-layer dielectric film 102 by, for example, but not limited to, heat-curing, or the like; removing the single-layer dielectric film 102 from the blank liner 2; and laminating the single-layer dielectric film 102 with the fabric sheet 101 to form the flexible composite substrate 10.

Figure 4:
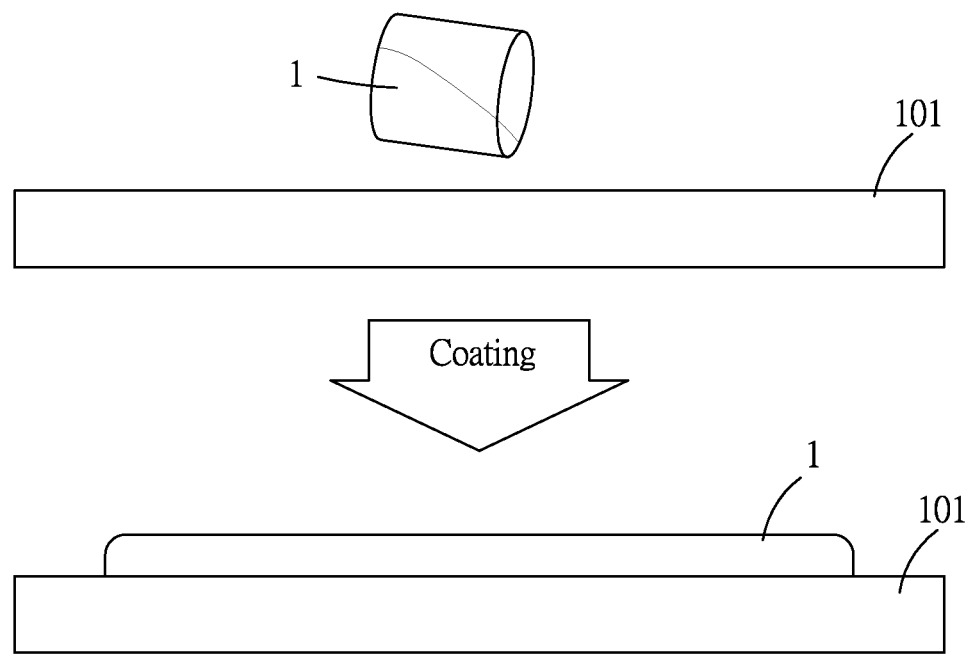
FIGS. 4 and 5 are schematic views illustrating some intermediate steps of a coating method for manufacturing the embodiment shown in FIG. 1.
Figure 5:
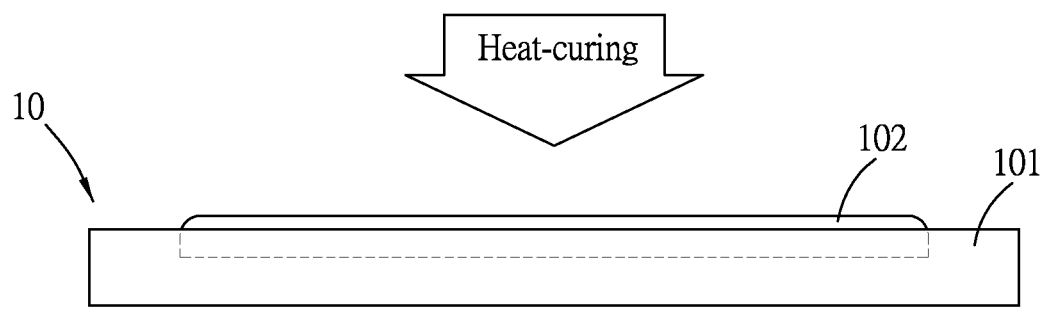

Referring to FIGS. 4 and 5, the coating method for manufacturing the flexible composite substrate 10 includes the steps of: coating the liquid mixture 1, which includes the dielectric resin matrix and the low dielectric loss material, on the fabric sheet 101 directly; and forming the liquid mixture 1 into the single-layer dielectric film 102 immersed into the fabric sheet 101 by, for example, but not limited to, heat-curing, or the like, so as to obtain the flexible composite substrate 10.

Figure 6:
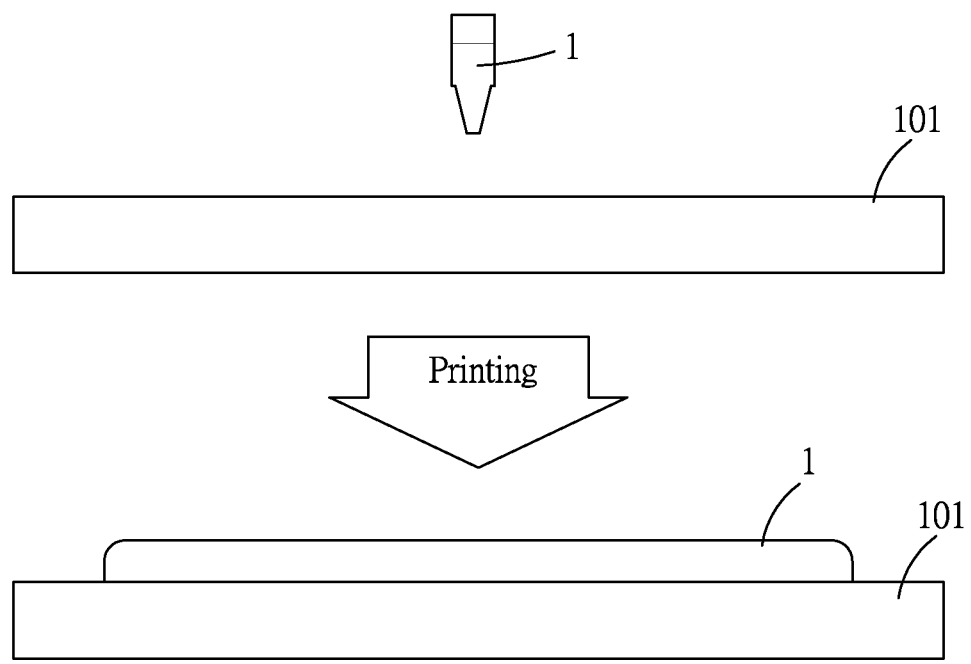
FIGS. 6 and 7 are schematic views illustrating some intermediate steps of a printing method for manufacturing the embodiment shown in FIG. 1.
Figure 7:
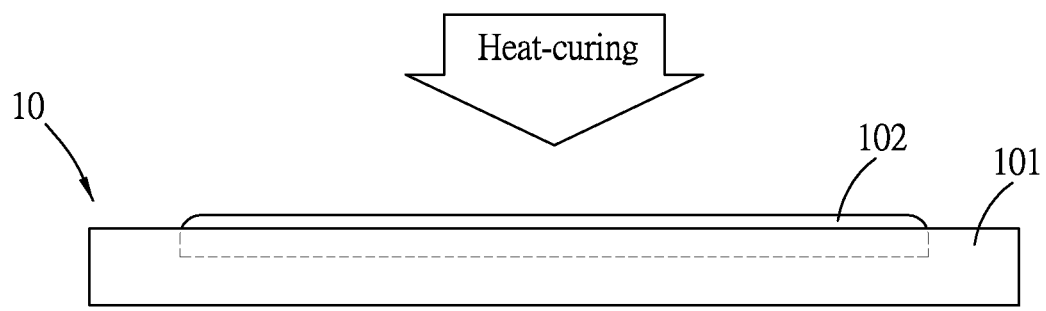

Referring to FIGS. 6 and 7, the printing method for manufacturing the flexible composite substrate 10 includes the steps of: printing the liquid mixture 1, which includes the dielectric resin matrix and the low dielectric loss material, on the fabric sheet 101 directly; and forming the liquid mixture 1 into the single-layer dielectric film 102 immersed into the fabric sheet 101 by, for example, but not limited to, heat-curing, or the like, so as to obtain the flexible composite substrate 10.

Figure 8:
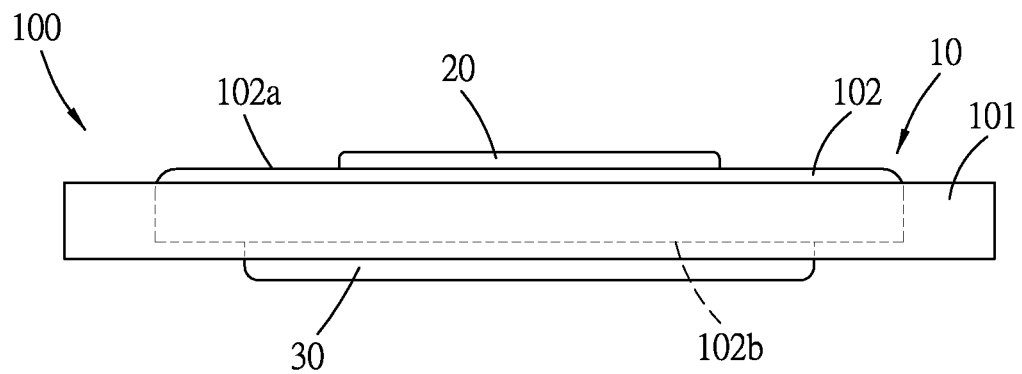
FIG. 8 is a schematic view illustrating a wearable antenna including the flexible composite substrate shown in FIG. 1.

Referring to FIG. 8, a wearable antenna 100 includes the flexible composite substrate 10, a conductive antenna layer 20, and a conductive ground layer 30. The flexible composite substrate 10 is connected between the conductive antenna layer 20 and the conductive ground layer 30. As described above, the flexible composite substrate 10 includes the fabric sheet 101 and the single-layer dielectric film 102 immersed into the fabric sheet 101. The conductive antenna layer 20 and the conductive ground layer 30 are disposed at two opposite sides of the flexible composite substrate 10. In some embodiments, the conductive antenna layer 20 may be disposed on a first surface 102a of the single-layer dielectric film 102, and the conductive ground layer 30 may be immersed into the fabric sheet 101 and may be disposed on a second surface 102b of the single-layer dielectric film 102 opposite to the first surface 102a. Each of the conductive antenna layer 20 and the conductive ground layer 30 may be formed on the flexible composite substrate 10 using a functional ink. In some embodiments, the functional ink may include, for example, but not limited to, a silver ink, or other conductive inks. Formation of each of the conductive antenna layer 20 and the conductive ground layer 30 may be conducted by screen printing, inkjet printing, dispense printing, or the like.

The flexible composite substrate of the present disclosure may be used to manufacture a wearable antenna for an e-textile for a wide frequency wireless application (for example, the 5G communication systems). The flexible composite substrate of the present disclosure has low dielectric constant (k), low dissipation factor (Df), and low moisture absorption, and thus exhibits a low dielectric loss property. In some embodiment, the dielectric constant (k) has a value ranging from about 2.1 to about 3.1. In some embodiments, the dissipation factor has a value ranging from about 0.0012 to about 0.012. In addition, the flexible composite substrate of the present disclosure may be manufactured at a low cost. The flexible composite substrate of the present disclosure also has a low permittivity and a small thickness, and thus can be used to manufacture a wearable antenna with superior performance, such as high bandwidth and high efficiency.

In the flexible composite substrate of the present disclosure, the single-layer dielectric film is immersed into the fabric sheet to provide a smooth surface and a better uniformity, and to cover the porosity of the fabric sheet. Therefore, the functional ink can be printed on the flexible composite substrate directly to manufacture the wearable antenna. Therefore, the wearable antenna thus manufactured is thin, and more wearable and comfortable for a human body. In addition, since the dielectric resin matrix (for example, but not limited to, silicone resin) is included in the flexible composite substrate of the present disclosure to provide the flexible composite substrate with a waterproof property, the flexible composite substrate of the present disclosure can be used for manufacturing a wearable antenna for an electrotherapy application, and can be double-sided printed without any liquid or moisture permeating therethrough.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A flexible composite substrate for a wearable antenna, comprising:
   a fabric sheet; and
   a single-layer dielectric film immersed into said fabric sheet, said single-layer dielectric film including a dielectric resin matrix and a low dielectric loss material which is mixed with said dielectric resin matrix and which serves as a wireless functional dielectric interface material.

2. The flexible composite substrate as claimed in claim 1, wherein said single-layer dielectric film is laminated with said fabric sheet to form the flexible composite substrate.

3. The flexible composite substrate as claimed in claim 1, wherein said dielectric resin matrix includes silicone resin, and said low dielectric loss material includes polyimide, polytetrafluoroethylene, liquid crystal polymer, or combinations thereof.

4. The flexible composite substrate as claimed in claim 1, wherein the flexible composite substrate has a dielectric constant value ranging from 2.1 to 3.1.

5. A wearable antenna, comprising:
a flexible composite substrate, which includes a fabric sheet and a single-layer dielectric film immersed into said fabric sheet;
a conductive antenna layer; and
a conductive ground layer,
said conductive antenna layer and said conductive ground layer disposed at said flexible composite substrate.

6. The wearable antenna as claimed in claim 5, wherein said single-layer dielectric film includes a dielectric resin matrix and a low dielectric loss material which is mixed with said dielectric resin matrix and which serves as a wireless functional dielectric interface material.

7. The wearable antenna as claimed in claim 6, wherein said dielectric resin matrix includes silicone resin, and said low dielectric loss material includes polyimide, polytetrafluoroethylene, liquid crystal polymer, or combinations thereof.

8. The wearable antenna as claimed in claim 5, wherein said single-layer dielectric film has a first surface and a second surface opposite to said first surface, and said conductive antenna layer and said conductive ground layer are disposed on said first surface and said second surface of said single-layer dielectric film, respectively.

9. The wearable antenna as claimed in claim 8, wherein said conductive ground layer is immersed into said fabric sheet.

10. The wearable antenna as claimed in claim 5, wherein each of said conductive antenna layer and said conductive ground layer is formed on said flexible composite substrate using a functional ink.

11. The wearable antenna as claimed in claim 10, wherein formation of each of said conductive antenna layer and said conductive ground layer is conducted by screen printing, inkjet printing, dispense printing, or combinations thereof.

12. The wearable antenna as claimed in claim 5, wherein said flexible composite substrate has a dielectric constant value ranging from 2.1 to 3.1.

13. The wearable antenna as claimed in claim 5, wherein said single-layer dielectric film is laminated with said fabric sheet to form said flexible composite substrate.

14. The wearable antenna as claimed in claim 5, wherein said flexible composite substrate is connected between said conductive antenna layer and said conductive ground layer.

15. A method for manufacturing a flexible composite substrate for a wearable antenna, comprising the steps of:
providing a liquid mixture which includes a dielectric resin matrix and a low dielectric loss material;
applying the liquid mixture on a blank liner by an applying technique;
forming the liquid mixture into a single-layer dielectric film;
removing the single-layer dielectric film from the blank liner; and
laminating the single-layer dielectric film with a fabric sheet to form the flexible composite substrate.

16. The method as claimed in claim 15, wherein the liquid mixture is coated on the fabric sheet directly, and the single-layer dielectric film is immersed into the fabric sheet to obtain the flexible composite substrate.

17. The method as claimed in claim 15, wherein the liquid mixture is printed on the fabric sheet directly; and the single-layer dielectric film is immersed into the fabric sheet to obtain the flexible composite substrate.

18. The method as claimed in claim 15, wherein the liquid mixture is formed into the single-layer dielectric film by heat-curing.

19. The method as claimed in claim 15, wherein the dielectric resin matrix includes silicone resin, and the low dielectric loss material includes polyimide, polytetrafluoroethylene, liquid crystal polymer, or combinations thereof.

20. A method for manufacturing a flexible composite substrate for a wearable antenna, comprising the steps of:
providing a liquid mixture which includes a dielectric resin matrix and a low dielectric loss material;
forming the liquid mixture into a single-layer dielectric film; and
laminating the single-layer dielectric film with a fabric sheet to form the flexible composite substrate,
wherein the liquid mixture is disposed on the fabric sheet directly, and the single-layer dielectric film is immersed into the fabric sheet to obtain the flexible composite substrate.

* * * * *